(12) United States Patent
Broekaart et al.

(10) Patent No.: US 9,138,980 B2
(45) Date of Patent: Sep. 22, 2015

(54) APPARATUS FOR MANUFACTURING SEMICONDUCTOR DEVICES

(71) Applicant: Soitec, Bernin (FR)

(72) Inventors: Marcel Broekaart, Theys (FR); Ionut Radu, Crolles (FR)

(73) Assignee: SOITEC, Bernin (FR)

( * ) Notice: Subject to any disclaimer, the term of this patent is extended or adjusted under 35 U.S.C. 154(b) by 0 days.

(21) Appl. No.: 13/624,470

(22) Filed: Sep. 21, 2012

(65) Prior Publication Data
US 2013/0032272 A1    Feb. 7, 2013

Related U.S. Application Data

(63) Continuation of application No. 12/888,251, filed on Sep. 22, 2010, now abandoned.

(30) Foreign Application Priority Data

Jun. 22, 2010  (FR) ...................................... 10 02618

(51) Int. Cl.
    *B32B 37/10*    (2006.01)
    *B32B 38/18*    (2006.01)
    *H01L 21/67*    (2006.01)

(52) U.S. Cl.
    CPC ...... *B32B 38/1858* (2013.01); *H01L 21/67092* (2013.01); *B32B 2309/64* (2013.01); *B32B 2309/65* (2013.01); *B32B 2309/68* (2013.01); *Y10T 156/10* (2015.01)

(58) Field of Classification Search
    CPC ............ B32B 2309/65; B32B 2309/64; B32B 2309/68; B32B 38/1858; H01L 21/67092
    USPC ................................. 156/285, 286, 381, 382
    See application file for complete search history.

(56) References Cited

U.S. PATENT DOCUMENTS 5,223,001 A * 6/1993 Saeki .......................... 29/25.01
5,421,953 A * 6/1995 Nagakubo et al. .............. 216/34
(Continued)

FOREIGN PATENT DOCUMENTS

| CN | 1936678 A | 3/2007 |
|----|-----------|--------|
| EP | 0 366 208 A2 | 5/1990 |

(Continued)

OTHER PUBLICATIONS

Preliminary Search Report and Written Opinion with English Translation for Application FR 1056719 dated Apr. 12, 2011.
(Continued)

*Primary Examiner* — Christopher Schatz
(74) *Attorney, Agent, or Firm* — TraskBritt

(57) ABSTRACT

The present invention relates to an apparatus for the manufacture of semiconductor devices wherein the apparatus includes a bonding module that has a vacuum chamber to provide bonding of wafers under pressure below atmospheric pressure; and a loadlock module connected to the bonding module and configured for wafer transfer to the bonding module. The loadlock module is also connected to a first vacuum pumping device configured to reduce the pressure in the loadlock module to below atmospheric pressure. The bonding and loadlock modules remain at a pressure below atmospheric pressure while the wafer is transferred from the loadlock module into the bonding module.

11 Claims, 3 Drawing Sheets

(56) References Cited

U.S. PATENT DOCUMENTS

| | | | |
|---|---|---|---|
| 5,537,884 A | 7/1996 | Nishimura et al. | 73/842 |
| 5,696,327 A | 12/1997 | Huang et al. | 73/845 |
| 5,769,991 A | 6/1998 | Miyazawa et al. | |
| 5,834,812 A | 11/1998 | Golland et al. | 257/347 |
| 5,937,312 A | 8/1999 | Iyer et al. | 438/459 |
| 6,008,113 A | 12/1999 | Ismail et al. | 438/615 |
| 6,113,721 A | 9/2000 | Secco d'Aragona et al. | 156/154 |
| 6,117,695 A | 9/2000 | Murphy et al. | 438/15 |
| 6,153,524 A | 11/2000 | Henley et al. | |
| 6,180,496 B1 | 1/2001 | Farrens et al. | 438/455 |
| 6,207,005 B1 | 3/2001 | Henley et al. | 156/345 |
| 6,221,774 B1 | 4/2001 | Malik | 438/690 |
| 6,309,505 B1 | 10/2001 | Takisawa et al. | |
| 6,387,815 B2 | 5/2002 | Sakamoto | 438/709 |
| 6,523,419 B1 | 2/2003 | Nonaka et al. | 73/827 |
| 6,616,332 B1 | 9/2003 | Renken et al. | 374/162 |
| 6,645,828 B1 | 11/2003 | Farrens et al. | 438/455 |
| 6,846,380 B2* | 1/2005 | Dickinson et al. | 156/345.31 |
| 6,908,832 B2 | 6/2005 | Farrens et al. | 438/455 |
| 7,250,368 B2 | 7/2007 | Kida et al. | 438/690 |
| 7,727,860 B2 | 6/2010 | Miyazaki et al. | 438/459 |
| 8,857,487 B2 | 10/2014 | Tsuno et al. | |
| 2001/0055863 A1 | 12/2001 | Nakano et al. | 438/549 |
| 2002/0187595 A1 | 12/2002 | Walitzki et al. | 438/184 |
| 2003/0079828 A1* | 5/2003 | Kassir et al. | 156/230 |
| 2003/0168145 A1 | 9/2003 | Suga et al. | 156/60 |
| 2004/0085858 A1 | 5/2004 | Khuri-Yakub et al. | 367/181 |
| 2004/0121556 A1 | 6/2004 | Kim et al. | 438/455 |
| 2004/0229444 A1 | 11/2004 | Couillard et al. | 438/455 |
| 2004/0246795 A1 | 12/2004 | Tomita | 365/200 |
| 2005/0081958 A1 | 4/2005 | Adachi et al. | 148/33.1 |
| 2005/0152089 A1 | 7/2005 | Matsuda et al. | 361/234 |
| 2006/0055003 A1 | 3/2006 | Tomita et al. | 257/629 |
| 2007/0039395 A1 | 2/2007 | Gupta et al. | 73/800 |
| 2007/0051462 A1* | 3/2007 | Nakayama et al. | 156/285 |
| 2007/0065678 A1 | 3/2007 | Ko et al. | |
| 2007/0072393 A1 | 3/2007 | Aspar et al. | 438/459 |
| 2007/0117229 A1 | 5/2007 | Schwarzenbach et al. | 438/14 |
| 2007/0158831 A1 | 7/2007 | Cha et al. | 257/724 |
| 2007/0237448 A1 | 10/2007 | Sato et al. | 385/13 |
| 2008/0044984 A1 | 2/2008 | Hsieh et al. | 438/459 |
| 2008/0053619 A1 | 3/2008 | Nakayama et al. | |
| 2008/0128621 A1 | 6/2008 | Berry | 250/338.1 |
| 2008/0128898 A1 | 6/2008 | Henderson et al. | 257/713 |
| 2008/0200008 A1 | 8/2008 | Kerdiles et al. | 438/455 |
| 2008/0260938 A1* | 10/2008 | Ikeda et al. | 427/66 |
| 2009/0023271 A1 | 1/2009 | Couillard et al. | 438/458 |
| 2009/0042363 A1 | 2/2009 | Miyazaki et al. | 438/459 |
| 2009/0111245 A1 | 4/2009 | Okabe et al. | 438/459 |
| 2010/0122762 A1 | 5/2010 | George | 156/64 |
| 2010/0155882 A1 | 6/2010 | Castex | 257/507 |
| 2011/0045611 A1 | 2/2011 | Castex et al. | 438/5 |
| 2011/0097874 A1 | 4/2011 | Broekaart et al. | 438/459 |
| 2011/0308721 A1 | 12/2011 | Broekaart | |
| 2012/0038027 A1 | 2/2012 | Broekaart | 257/618 |
| 2012/0048007 A1 | 3/2012 | Landru | 73/150 A |
| 2012/0067524 A1 | 3/2012 | Broekaart | |
| 2012/0067525 A1 | 3/2012 | Nakayama et al. | |

FOREIGN PATENT DOCUMENTS

| | | |
|---|---|---|
| EP | 0 444 942 B1 | 9/1991 |
| EP | 0 451 993 A2 | 10/1991 |
| EP | 0 854 500 B1 | 7/1998 |
| EP | 0 860 862 B1 | 8/1998 |
| EP | 0 935 280 B1 | 8/1999 |
| EP | 0 964 436 A2 | 12/1999 |
| EP | 1 189 266 A1 | 3/2002 |
| EP | 1 662 549 A1 | 5/2006 |
| EP | 1 887 613 A1 | 2/2008 |
| EP | 1 998 368 A2 | 12/2008 |
| EP | 2 200 077 A1 | 6/2010 |
| FR | 2 935 535 A1 | 3/2010 |
| JP | 3089519 A | 4/1991 |
| JP | 4263425 A | 9/1992 |
| JP | 04290215 A | 10/1992 |
| JP | 7045485 A | 2/1995 |
| JP | 9017984 A | 1/1997 |
| JP | 10256107 A | 9/1998 |
| JP | 11017701 A | 1/1999 |
| JP | 11067701 A | 3/1999 |
| JP | 11354761 A | 12/1999 |
| JP | 2001144274 A | 5/2001 |
| JP | 2001511608 A | 8/2001 |
| JP | 2003115519 A | 4/2003 |
| JP | 2007065521 A | 3/2007 |
| JP | 2007508690 A | 4/2007 |
| JP | 2009164252 A | 7/2009 |
| JP | 2009208084 A | 9/2009 |
| WO | WO 99/60607 A2 | 11/1999 |
| WO | WO 03/008938 A2 | 1/2003 |
| WO | WO 03/019157 A1 | 3/2003 |

OTHER PUBLICATIONS

European Search Report, French Appln. No. 1002618, dated Jan. 25, 2011.

International Search Report, PCT/EP2009/059961, mailed Oct. 5, 2009.

European Search Report for EP08291226 dated Jul. 7, 2009.

Gösele, U. et al., "Self-Propagating Room-Temperature Silicon Wafer Bonding in Ultrahigh Vacuum", Applied Phys. Lett., vol. 67, No. 24, pp. 3614-3615 (1995).

Andreas Plößl et al., "Covalent Silicon Bonding at Room TemperatureIn Ultra High Vacuum", Mat. Res. Soc. Symp. Proc., vol. 483, pp. 141-146, Materials Research Society (1998).

Hideki Takagi et al, "Wafer-Scale Spontaneous Bonding of Silicon Wafers by Argon-Beam Surface Activation at Room Temperature", Sensors and Actuators A, vol. 105, pp. 98-102 (2003).

R. H. Esser et al., "Improved Low-Temperature Si-Si Hydrophilic Wafer Bonding", Journal of the Electrochemical Society vol. 150, pp. G228-G231 (2003).

Burns, James A. et al., "A Wafer-Scale 3-D Circuit Integration Technology", IEEE Transactions on Electron Devices, vol. 53, No. 10, pp. 2507-2516 (2006).

Steen, Steven E. et al., "Overlay as the Key to Drive Wafer Scale 3D Integration", Microelectronic Engineering vol. 84, pp. 1412-1415 (2007).

Topol, Anna W. et al., "3D Fabrication Options for High-Performance CMOS Technology", Wafer Level 3 ICs Process Technology, Tan, Gutmann, Reif Eds., pp. 197-217. (2008).

W.P. Maszara, et al.,"Bonding of Silicon Wafers for Silicon-on-Insulator", J. Appl. Phys., vol. 64, No. 10, pp. 4943-4950, (1988).

Takagi et al., "Room Temperature Silicon Wafer Direct Bonding in Vacuum by Ar Beam Irradiation," Micro Electro Mechanical Systems, 1997. MEMS '97, Proceedings, IEEE, Tenth Annual International Workshop on Jan. 26, 1997-Jan. 30, 1997, Nagoya, Japan, pp. 191-196. Online search. URL:http://ieeexplore.ieee.org/stamp/stamp.jsp?tp=&arnumber=581801.

Chinese Office Action and Search Report for Chinese Application No. 201110212252.7 dated May 28, 2014, 9 pages.

Japanese Office Action for Japanese Application No. P2011-136614 dated Feb. 6, 2014, 4 pages.

Japanese Office Action for Japanese Application No. 2011-283992 dated Dec. 10, 2014, 4 pages.

Chinese Office Action for Chinese Application No. 201110414307.2 dated Jan. 12, 2015, 2 pages.

* cited by examiner

APPARATUS FOR MANUFACTURING SEMICONDUCTOR DEVICES

FIELD OF INVENTION

The present invention relates to an apparatus for the manufacture of semiconductor devices wherein the apparatus comprises a bonding module for the molecular bonding of wafers.

BACKGROUND OF THE INVENTION

Three-dimensional (3-D) integrated circuit technology where circuit structures formed on several silicon-on-insulator (SOI) substrates are bonded together and integrated into a 3-D circuit with dense-vertical connections becomes of increasing importance in modern semiconductor technology (see, for example, paper by Burns et al., entitled "A Wafer-Scale 3-D Circuit Integration Technology," IEEE TRANSACTIONS ON ELECTRON DEVICES, VOL. 53, NO. 10, OCTOBER 2006, pages 2507-2516). The building blocks of the 3-D circuit integration technology are fully depleted SOI (FDSOI) circuit fabrication, precision wafer-wafer alignment, low-temperature wafer-wafer oxide bonding (molecular bonding, oxide fusion bonding), and electrical connection of the circuit structures with dense vertical interconnections. When compared to conventional bump bond technology, the wafer-scale 3-D technology offers higher density vertical interconnections and reduced system power.

Molecular bonding of wafers requires that the surfaces of the same are sufficiently smooth, free of particles or contamination, and that they are sufficiently close to each other to allow contact to be initiated, typically at a distance of less than a few nanometers at a point of initiation. The contact will be initiated at a local point where the two wafer surfaces have the closest approach to each other: no pressing forces need to be applied to the wafers. In this case, the forces of attraction between the two surfaces are sufficiently high to cause propagation from this location of a "bonding wave" and molecular adhesion (bonding induced by all of the forces of attraction—Van Der Waals forces—of the electronic interaction between the atoms or the molecules of the two surfaces of the wafers that are to be bonded). By the term "bonding wave" it is referred to the front of the bond or the molecular adhesion spreading from the point of initiation and corresponding to the dissemination of the forces of attraction (Van Der Waals forces) from the point of initiation over the entire surface of close contact between the two wafers (bonding interface).

However, molecular bonding faces the severe problems of bonding interface defects, wafer misalignment and wafer overlay defects due to heterogeneous distortions which appear in the transfer layer during its assembly with the receiving substrate. Such distortions are not the result of elementary transformations (translation, rotation or combinations thereof) that could originate in inaccurate assembly of the substrates (misalignment).

These distortions result from non-homogeneous deformations that appear in the layer while it is being assembled with the final substrate. In fact, such distortions can lead to variations in position which may be in the order of several hundred nanometers or even microns. Since these distortions are not homogenous, it is not possible to correct completely these misalignment errors during subsequently performed photolithography steps. Thereby non or dysfunctional semiconductor devices may result.

In view of the above and in spite of the recent technological progress there is a need for an apparatus for the manufacture of semiconductor devices that provide molecular bonding of wafers for 3D integrated circuit technology with sufficient accuracy, in particular, alignment and suppression of bonding interface defects, as well as a high through-put.

SUMMARY OF THE INVENTION

The present invention relates to an apparatus for the manufacture of semiconductor devices comprising a bonding module comprising a vacuum chamber to provide bonding of wafers under a pressure below atmospheric pressure; and a loadlock module connected to the bonding module and configured and dimensioned for wafer transfer to the bonding module and connected to a first vacuum pumping device configured to reduce the pressure in the load lock module to below atmospheric pressure.

The apparatus may further comprising a second vacuum pumping device connected via a control valve to the vacuum chamber of the bonding module and configured to reduce the pressure in the vacuum chamber of the bonding module below atmospheric pressure. The apparatus provides external access to the loadlock module and has the load lock module connected to the bonding module by gates, wherein the loadlock module comprises a first gate that can be opened and closed for receipt of a wafer from an external environment and a second gate that can be opened and closed for transfer of a wafer from the loadlock module to the bonding module.

The apparatus may also have a larger loadlock module, wherein the loadlock module comprises a multi wafer storage system for storing multiple wafers to be transferred to the bonding module.

The apparatus may further comprise at least one additional loadlock module connected to the bonding module and configured and dimensioned to receive one or more bonded wafers from the bonding module.

The apparatus also has chucks that can hold and move the first and second wafers, wherein the bonding module comprises at least a first moveable bonding chuck configured and dimensioned to hold a first wafer and a second moveable bonding chuck different from the first bonding chuck and configured and dimensioned to hold a second wafer different from the first wafer. The first and second bonding chucks are configured to hold the first and the second wafer, respectively, in a within less than 10° of a vertical position within less than 10° with respect to a horizontal plane whereupon the bonding module is located, and the first bonding chuck and/or the second bonding chuck is made of metal or ceramics that resists bending and bowing. The first bonding chuck and second bonding chuck can be configured and dimensioned to hold first and second wafers that are at least 300 mm in diameter.

The apparatus can further comprise a control unit configured to control the first and the second bonding chucks to move towards each other, and to locate the first and the second wafers at a predetermined distance to each other, release the first and the second wafers at the predetermined distance, and to initiate local application of a force to at least one of the first and the second wafers such that they locally become that close to each other that bonding is initiated. The apparatus can also further comprise a control unit configured to control the first and the second bonding chucks to move towards each other to locate the first and the second wafers at a predetermined distance to each other and, subsequently, locally decreasing the clamping force applied by the first and/or second bonding chucks in order to hold the first and second wafer, respectively, such that the first and the second wafers locally become that close to each other that bonding is initiated.

The apparatus can have a control unit, wherein the control unit is configured to control gradual or non-gradual release of the first and/or second wafer, wherein the first and the second wafer become sufficiently close to each other at an initial location that bonding is initiated.

The invention also relates to a manufacturing system comprising the apparatus as described above, and further comprising a load port module configured and dimensioned to introduce a wafer into the manufacturing system; a plasma module configured to perform a plasma treatment of a surface of the wafer introduced in the manufacturing system; a cleaning module configured to clean the surface of the wafer; and a moveable robot device configured and dimensioned to transport the wafer from one of either the load port module, plasma module, cleaning module, and loadlock module to any other one of these modules. The present invention also relates to a method for bonding semiconductor wafers, comprising the steps of evacuating a vacuum chamber of a bonding module; transferring at least a first wafer and a second wafer from an external environment to a loadlock module that is connected to the bonding module; evacuating the loadlock module after transfer of at least the first and second wafers to the loadlock module; transferring at least the first and second wafers from the evacuated loadlock module to the evacuated vacuum chamber of the bonding module; positioning the first wafer and a second wafer on a first and a second bonding chuck, respectively; and moving the first and the second wafer towards each other by movement of the first and/or second bonding chuck such that a main surface of the first wafer and a main surface of the second wafer locally come sufficiently close to each other to allow bonding to be initiated. The method may also further comprise controlling the first and second bonding chucks with a control unit to either unclamp the first and second wafers in a gradual or non-gradual manner. The method also involves positioning a first wafer and a second wafer, wherein the first and the second wafers are positioned in a vertically or within less than 10° of a vertical position within less than 10° with respect to a horizontal plane whereupon the bonding module is located on the first and the second bonding chuck, respectively, and moved into a vertical the position and sufficiently close to each another to allow bonding to be initiated. The method may further comprise adjusting the vacuum of the vacuum chamber after transfer of at least the first wafer.

DETAILED DESCRIPTION OF THE INVENTION

Figure 1:
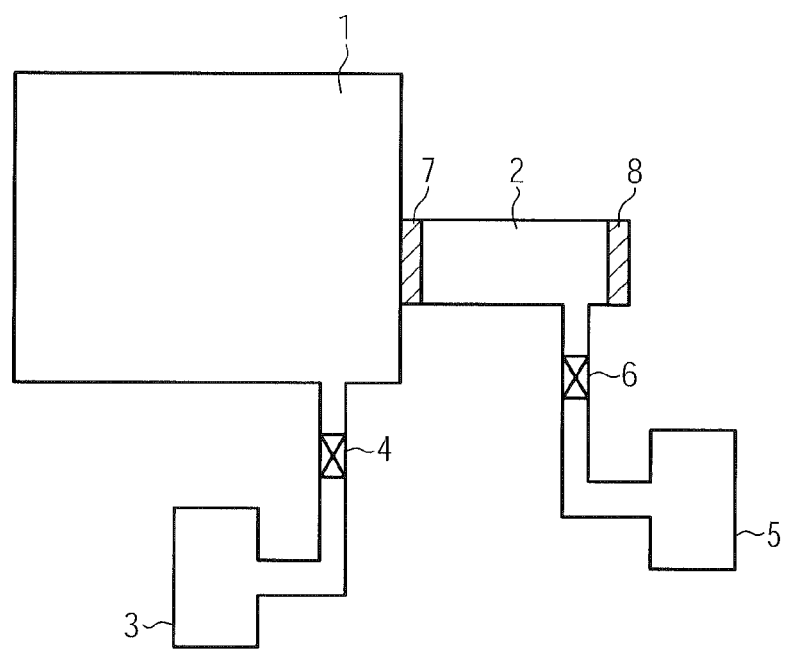
FIG. 1 illustrates an example, of the inventive apparatus for the manufacture of a semiconductor device comprising a bonding module and a load lock module connected to the bonding module.

The present invention addresses the above-mentioned need and, accordingly, relates to an apparatus for the manufacture of semiconductor devices comprising a bonding module comprising a vacuum chamber to provide bonding of wafers under a pressure below atmospheric pressure, and a loadlock module connected to the bonding module and configured for wafer transfer to the bonding module and connected to a first vacuum pumping device configured to reduce the pressure in the loadlock module below atmospheric pressure.

According to the invention molecular bonding of wafers is performed in an evacuated vacuum chamber of a bonding module. Since the bonding is performed under (partial) vacuum, bonding interface defects, such as edge voids, can be significantly suppressed without affecting the bonding strength. In addition, wafers are transferred from the evacuated loadlock module to the vacuum chamber of the bonding module thereby significantly increasing the throughput as compared to the prior art. Since the loadlock module provides the wafers to the bonding module at vacuum pressure close to the low-pressure of the evacuated vacuum chamber of the bonding module, switching of the bonding module from vacuum pressure to atmospheric pressure and vice versa between two bonding steps (bonding step and step of transfer of at least one wafer from the loadlock module to the bonding module) is avoided. The bonding module and loadlock module are air tight, so as to be sealed against the external atmospheric pressure, in order to maintain a vacuum pressure below one atmosphere during evacuation, transfer and bonding.

The loadlock module is evacuated by a first pumping device, for example, to a pressure between about 5 mbars to below atmospheric pressure (below 1 bar), or more preferably, to a pressure in the range of 1 mbars to 10 mbars. The vacuum chamber of the bonding module is, for example, evacuated by a second pumping device to a pressure in the range of 0.01 mbars to 10 mbars, or more preferably, 0.1 mbars to 5 mbars. It is also noted that the temperature in the vacuum chamber is kept at room temperature in order to avoid deformation of the wafers due to thermal expansion of the wafer semiconductor material. The first and/or the second pumping devices can be connected to the loadlock module and the vacuum chamber of the bonding module, respectively, by respective separate control valves provided to control the desired degree of vacuum. For both the first and the second pumping device a multi-stage rotary vane pump can be provided, for example.

It is noted that the bonding module encloses all means and devices necessary for the aligned wafer bonding process under vacuum, and is, thus, hermetically closed from the environment. The loadlock module may be configured to receive and transfer to the bonding module one wafer at a time or it may be configured to receive multiple wafers at the same time, that can be stored in a multi wafer storing system provided in the loadlock module. In the former case, the size of the loadlock module can be minimized such that the vacuum of the vacuum chamber of the bonding module is not heavily affected by opening a gate separating the bonding module from the loadlock module during wafer transfer. In the latter case, the throughput can be increased.

In particular, the loadlock module may comprise a first gate that can be opened and closed for receipt of a wafer and a second gate that can be opened and closed for transfer of a wafer from the loadlock module to the bonding module. After the wafer is received in the loadlock module via the opened first gate and the first gate is closed again the first pumping device can start evacuating the loadlock module.

According to an embodiment of the inventive apparatus at least one additional loadlock module connected to the bonding module and configured to receive one or more wafers or wafer stacks that were already bonded in the bonding module is provided in order to even further increase the throughput by allowing a first loadlock module to act as a source of unbonded wafers and the second loadlock module to act as a receiver of bonded wafers.

The bonding module may comprise at least a first moveable bonding chuck configured to hold a first wafer and a second moveable bonding chuck different from the first bonding chuck and configured to hold a second wafer different from the first wafer. A robot means or devices can be provided inside the bonding module that is configured to grip the wafers from the loadlock system and position them on the bonding chuck. Gripping can be achieved by mechanical means, electrostatic means or vacuum (if the clamping vacuum is well below the operating vacuum level of the vacuum chamber of the bonding module). The robotic device can also include any arms, joints, translational or rotational motion devices, positioning sensors and actuators known to those in the art.

Two movable bonding chucks, positioned face to face, to support and clamp the wafers may be provided inside the vacuum chamber of the boning module. The chucks are movable in translation and rotation in order to be able to position and align the two wafers in front of each other. Each bonding chuck shall be provided with a planarity as good as possible, because it has been determined that chuck bow is one of the main reasons for overlay defects. According to an embodiment the chucks are made of metal or ceramics, which resist bending and bowing, and cannot be easily deformed and maintain the planarity of the wafer. Bow of the chucks (maximum deviation from a median plane) should preferably be below 1 micron or even below 0.1 micron.

The first and second bonding chucks can be configured, dimensioned and orientated to hold the first and the second wafer, respectively, in a vertically or within less than 10° of a vertical position within less than 10° with respect to a horizontal plane whereupon the bonding module is located. Each wafer has two main surfaces and four side surfaces. According to this example, the main surfaces of the wafers are orientated almost vertically with respect to a horizontal plane whereupon the bonding module is located. In particular, the main surfaces of the wafers are orientated inclined to the horizontal plane whereupon the bonding module is located with an angle of less than about 10°, more particularly, with an angle of less than about 5°, and even more preferably, with an angle of at most about 1°. By this orientation, deformation (overlay errors) of the wafers due to their own weight can be avoided and even large wafers of more than 300 mm in diameter can reliably be processed.

The apparatus may also include a control unit for controlling operation of different modules of the apparatus as well as the transfer of wafers from one module to another by means of the robotic devices.

If required by the application, an optical positioning system can be provided in the bonding module that is operated to identify the exact position of alignment marks on the wafers, and the two chucks are then moved in translation and rotation to align the wafers in accordance with the identified alignment marks.

The actual molecular (oxide fusion) bonding process can be controlled by the above-mentioned control unit according to different alternatives. According to a first embodiment, the clamping is released to free the two wafers from their chuck, and an additional force is applied locally to cause intimate contact (in terms of the acting molecular forces) of the wafers and initiate the bonding wave propagation. This additional force should be minimized, for instance below 5 N or even below 1 N, so that no deformation of the wafer results. Thus, the inventive apparatus may further comprise a control unit configured to control the first and the second bonding chucks to move to each other to locate the first and the second wafers at a predetermined distance to each other, release the first and the second wafers at the predetermined distance and to initiate local application of a force by an appropriate local force application means or device to at least one of the first and the second wafers such that they locally become that close to each other that bonding is initiated. Here and in the following it is understood that bonding is initiated by molecular forces acting between the main surfaces of the wafers that have approached or been positioned closely to each other and are to be bonded.

According to a second embodiment, the intimate contact is first created, and then the un-clamping of the wafer is performed gradually. Intimate contact, in terms of the acting molecular forces, can be created by slightly deforming locally at least one of the wafers while bringing the two wafers in contact to each other. Deformation can be realized by locally decreasing the clamping force that retains the wafer to the chuck. Once intimate contact has been created, the un-clamping is performed gradually to control the propagation speed of the bonding wave. According to a third embodiment, un-clamping is performed non-gradually rather than gradually without any control of the bonding wave propagation. The latter approach is easier to implement.

Accordingly, the apparatus according to the present invention may further comprise a control unit configured to control the first and the second bonding chucks to move to each other to locate the first and the second wafers at a predetermined distance to each other, and subsequently, locally decreasing the clamping force applied by the first and/or second bonding chucks in order to hold the first and second wafer, respectively, such that the first and the second wafers locally become close enough to each other that bonding is initiated.

The control unit may be configured to control gradual or non-gradual release of the first and/or second wafer, wherein the first and the second wafer become sufficiently close to each other at an initial location that bonding is initiated, where the wafers are sufficiently close when the surfaces of the wafers are less than a few nanometers from each other, or the forces of attraction between the two surfaces are sufficiently high to cause propagation from this location of a "bonding wave" and molecular adhesion.

The present invention, moreover, provides a manufacturing system (see also detailed discussion below) comprising the apparatus of one of the above-described examples and further comprising a load port module configured to introduce a wafer from an external environment in the manufacturing system; a plasma module configured to perform a plasma treatment of a surface of the wafer introduced in the manufacturing system; a cleaning module configured to clean the surface of the wafer; and a moveable robot means or device configured and dimensioned to transport the wafer from one of the load port module, plasma module, cleaning module, and loadlock module to another one of these modules.

One or more plasma modules can be provided for activating one or both of the main surfaces of wafers. The cleaning module cleans and/or brushes the surfaces of the wafers that are to be bonded to each other in the bonding module. The robot means is a device suitably configured and dimensioned to manipulate and transfer the wafers from the load port to any individual module, and also from any one module to any other. The robot in a preferred embodiment moves along a robot moving area, to enable the transfer of the wafer from one place to another. The system may also include a control unit controlling operation of the individual modules and transfer of the wafers by the robotic devices.

The present invention also relates to a method for the bonding of semiconductor wafers, comprising the steps of evacuating a vacuum chamber of a bonding module; transferring at least a first wafer to a loadlock module that is connected to the bonding module; evacuating the loadlock module after transfer of at least the first wafer to the loadlock module; transferring at least the first wafer from the evacuated loadlock module to the evacuated vacuum chamber of the bonding module; optionally adjusting the vacuum of the vacuum chamber after transfer of the at least the first wafer if this is desired due to quality reasons of the bonded wafers; positioning the first wafer and a second wafer on a first and a second bonding chuck, respectively; and moving the first and the second wafer to each other by movement of the first and/or second bonding chuck such that a main surface of the first wafer and a main surface of the second wafer locally come that close to each other that bonding is initiated.

In particular, the first and the second wafers can be positioned in a vertically or within less than 10° of a vertical position with respect to a horizontal plane whereupon the bonding module is located on the first and the second bonding chuck, respectively, and moved in that vertical position that close to each other that bonding is initiated.

Additional features and advantages of the present invention will be described with reference to the drawings. In the description, reference is made to the accompanying figures that are meant to illustrate preferred embodiments of the invention. It is understood that such embodiments do not represent the full scope of the invention, and only represent particular examples of present invention.

As shown in FIG. 1, the apparatus of the present invention according to a particular example comprises a bonding module 1 and a loadlock module 2. Bonding is performed in a vacuum chamber of the bonding module 1. The vacuum in the vacuum chamber of the bonding module 1 is established by a vacuum pump 3 that is connected to the vacuum chamber of the bonding module 1 via a conduit or vacuum manifold having a control valve 4. Similarly a vacuum can be provided in the loadlock module 2 by another vacuum pump 5 that is connect by conduit or vacuum manifold having another control valve 6 to the loadlock module 2. Moreover, the load lock module 2 comprises a first gate 7 that is opened when a wafer is transferred from the load lock module 2 to the bonding module 1 and a second gate 8 that is opened when a wafer is transferred by a robot to the loadlock module 2 from outside the bonding and loadlock modules.

The loadlock module 2 may be configured as a one-wafer transfer module providing one single wafer at the same time to the bonding module 1 or may include a multi wafer storing systems for receiving multiple wafers via the second gate 8 from an external environment and storing the same and, then, providing these multiple wafers to the bonding module 1 at the same time.

According to the present invention after one or more wafers have been loaded into the loadlock module 2 and the second gate 8 has been closed (the first gate 7 is kept closed during the loading procedure), the loadlock module 2 is evacuated to some predetermined pressure. Evacuation may be provided by the pumping device 5 at a rate of between 2.5 and 1,000 m³/h, in particular, more than 500 m³/h. The loadlock module 2 is evacuated for example, to a pressure of about 5 mbars to some hundred mbar or to below atmospheric pressure (where 1 bar=100,000 Pa=0.987 atm). The vacuum chamber of the bonding module 1 is, for example, evacuated to a pressure in the range of 0.01 mbars to 10 mbars, or more preferably, 0.1 mbars to 5 mbars.

After evacuation, the one or more wafers are transferred upon opening of the first gate 7 to the vacuum chamber of the bonding module 1 that was already evacuated by the first pumping device 3, such as a multi-stage rotary vane pump. Since during this transfer of the one or more wafers from the loadlock module 2 to the bonding module 1 the bonding module is not exposed to atmospheric pressure, only a relatively slight adjustment of the pressure of the vacuum chamber of the bonding module 1 is necessary if at all after completion of the wafer transfer and closing of the first gate 7. Thus, the throughput can significantly be increased, since the bonding module 1 does not cycle completely between atmospheric pressure and the operating vacuum pressure.

It is noted that the throughput can be even further increased when another loadlock module 2' is provided, for example, on the left-hand-side of the bonding module 1 of FIG. 1 and connected to the bonding module 1 by another gate 7' to receive the already bonded wafers. The loadlock module 2' can be used to output the bonded wafers from the bonding module 1 to the loadlock module 2', where the bonded wafers can then be passed to the external environment through another gate 8', while the bonding module 1 and load lock module 2 remain under vacuum. In this case, the other loadlock module 2' is evacuated before transfer of the bonded wafers from the bonding module 1.

Figure 2:
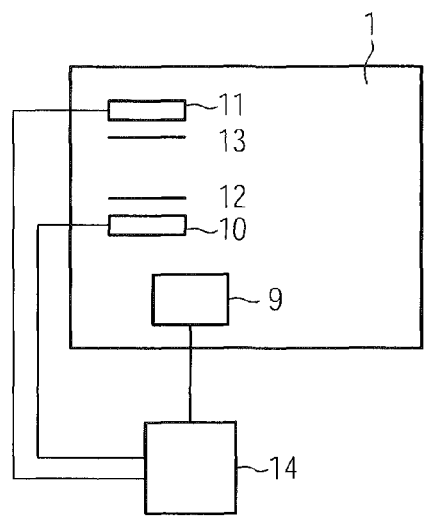
FIG. 2 illustrates an example of a bonding module according to the present invention.

In FIG. 2, an example of the bonding module 1 according to the present invention is illustrated. The bonding module comprises a vacuum chamber 1 and is connected to a pumping device (not shown) as described with reference to FIG. 1. In addition, the bonding module comprises an optical system 9 that allows determining the exact position of alignment marks on the surfaces of the wafers to be bonded in the bonding module 1. The optical system 9 is only necessary if the two wafers need to be perfectly aligned. This is the case when the two wafers present micro-components. The term micro-components is meant to mean elements that result from technical steps carried out on or in the layers that must be positioned with precision. Thus, the micro-components may be active or passive components, a mere contact point, or interconnections, like copper contact and interconnects. In the case of the process comprising only that of bonding one wafer with micro-components onto a virgin support wafer the alignment step may be skipped, and thus provision of the optical system 9 are not necessary.

Furthermore, the bonding module 1 is provided with a first bonding chuck 10 and a second bonding chuck 11 that clamp a first wafer 12 and a second wafer 13, respectively. The bonding chucks 10 and 11 may be made of metal or ceramics to maintain planarity of the wafers 12 and 13. Whereas in FIG. 2 the bonding chucks 10 and 11 are shown to hold the wafers 12 and 13 with their horizontally orientated main surfaces face-to-face, the bonding chucks 10 and 11 may advantageously be arranged to hold the wafers 12 and 13 with their vertically orientated main surfaces face-to-face. In this case, deformation of the wafers due to their own weight can be avoided.

In the example shown in FIG. 2, the optical system 9 is electrically coupled to a control unit 14 that is computing the displacement of the bonding chucks 11 and 12 in the plane of alignment and in rotation in order to perfectly align the two wafers 12 and 13. Moreover, the control unit 14 controls movement of the bonding chucks 11 and 12 towards each other until the wafers 12 and 13 come into contact for molecular bonding.

Figure 3:
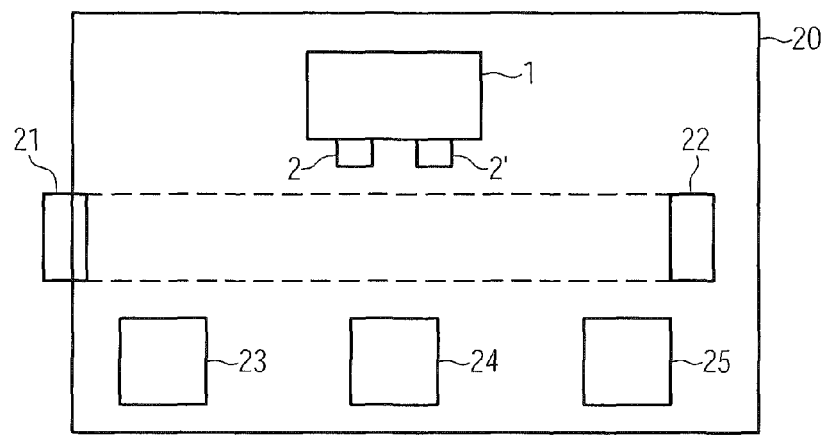
FIG. 3 illustrates an example of a manufacturing system comprising the apparatus illustrated in FIG. 1.
Figure 4:
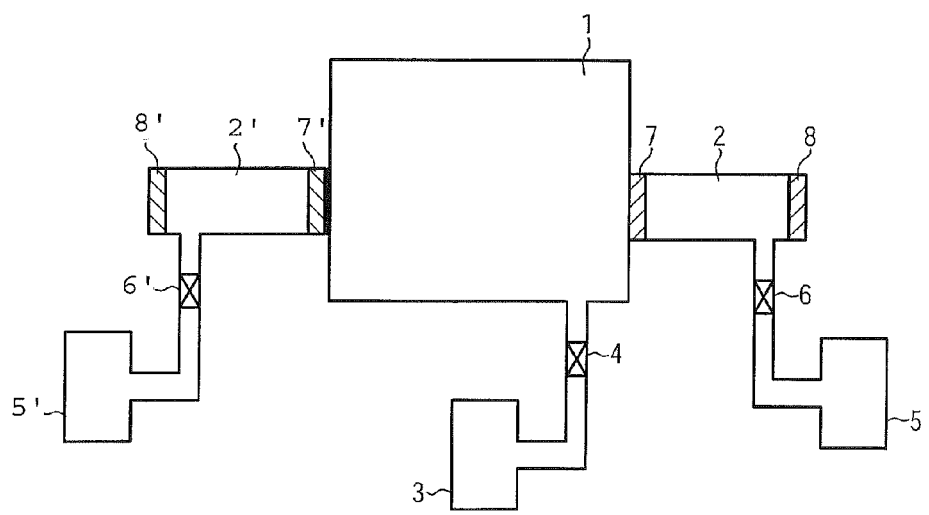
FIG. 4 illustrates a preferred embodiment in which a second loadlock module is connected to the bonding module to improve wafer throughput.

FIG. 3 illustrates an example of a manufacturing system 20 comprising the apparatus illustrated in FIG. 1. In particular, the manufacturing system 20 comprises a bonding module 1, such as for example, the bonding module 1 shown in FIG. 2, and two loadlock modules 2 and 2'. The manufacturing system 20 includes a load port 21 for introducing wafers into the manufacturing system 20. A robot device 22 is configured and dimensioned to manipulate and transfer the wafers from the load port 21 to any individual module of the manufacturing system 20, and also from one module to the other. The robot is moving along a robot moving area that may be predetermined (indicated by dashed lines), to enable the transfer of the wafer from one place or module to another.

In addition, the manufacturing system 20 comprises at least one plasma station 23 for activating one or two main surfaces of the wafers introduced into the manufacturing system 20. In order to minimize the surface preparation time, a second plasma station could be added, if the wafer processing requires that both main surfaces of the wafers need to be activated. Alternatively, the same plasma station 23 can be used to treat both main surfaces. A first cleaning station 24 is provided to clean a bonding main surface of a first wafer and a second cleaning station 25 is provided to clean a bonding main surface of a second wafer.

The manufacturing system 20, further comprises a control unit (not shown in FIG. 3) for controlling the robot device 22 for transporting wafers in the manufacturing system 20. For example, the control unit may control the robot means or device 22 to pick a first wafer from load port 21 and transport it to plasma station 23; pick a second wafer from load port 21 and transport it to cleaning station 25; pick the first wafer from plasma station 23 and transport it to cleaning station 24; pick the second wafer from cleaning station 25 and transport it to loadlock module 2'; pick the first wafer from cleaning station 24 and transport it to loadlock module 2; and pick bonded first and second wafers after they have been processed in the bonding module 1 from the loadlock module 2 or 2' and transport it to the load port 21.

All previously discussed embodiments are not intended as limitations but serve as examples illustrating features and advantages of the invention. It is to be understood that some or all of the above described features can also be combined in different ways.

What is claimed is:

1. An apparatus for the molecular bonding of semiconductor devices, the apparatus comprising:
   a bonding module comprising a vacuum chamber to provide bonding of a first wafer and a second wafer under a pressure below atmospheric pressure, and at least a first bonding chuck and a second bonding chuck configured to hold the first wafer and the second wafer, respectively, with the main surfaces of the first and second wafers arranged face-to-face in vertical orientation with respect to a horizontal plane whereupon the bonding module is located, wherein the first bonding chuck is separate from the second bonding chuck;
   a loadlock module connected to the bonding module and configured and dimensioned for wafer transfer to the bonding module and also connected to a first vacuum pumping device configured to reduce the pressure in the loadlock module to below atmospheric pressure, wherein the loadlock module comprises a first gate that can be opened and closed for receipt of the first and second wafers from an external environment and a second gate that can be opened and closed for transfer of the first and second wafers from the loadlock module to the bonding module; and
   a control unit configured to control the first and the second bonding chucks to move towards each other to locate the first and the second wafers at a predetermined distance from each other, such that the first and the second wafers locally become sufficiently close to each other that molecular bonding is initiated between the first wafer and the second wafer, and to release the first and second wafers at the predetermined distance, and
   wherein the bonding and loadlock modules remain at a pressure below atmospheric pressure while at least one of the first wafer and the second wafer is transferred from the loadlock module into the bonding module through the second gate.

2. The apparatus according to claim 1, further comprising a second vacuum pumping device connected via a control valve to the vacuum chamber of the bonding module and configured to reduce the pressure in the vacuum chamber of the bonding module to below atmospheric pressure.

3. The apparatus according to claim 1, wherein the loadlock module comprises a multi wafer storage system for storing multiple wafers to be transferred to the bonding module.

4. The apparatus according claim 1, further comprising at least one additional loadlock module connected to the bonding module and configured and dimensioned to receive the bonded first and second wafers from the bonding module.

5. The apparatus according to claim 1, wherein the first and second bonding chucks are configured to initially hold the first and the second wafers in a parallel alignment.

6. The apparatus according to claim 1, wherein at least one of the first bonding chuck and the second bonding chuck is made of metal or ceramics that resists bending and bowing.

7. The apparatus according to claim 1, wherein the first bonding chuck and second bonding chuck are configured and dimensioned to hold first and second wafers that are at least 300 mm in diameter.

8. The apparatus according to claim 1, wherein the control unit is configured to initiate local application of a force to at least one of the first and the second wafers.

9. The apparatus according to claim 1, wherein the control unit is further configured to release the first and second wafers by decreasing the clamping force applied by the first and/or second bonding chucks in order to allow initiation of the bonding.

10. The apparatus according to claim 9, wherein the control unit is configured to control gradual or non-gradual release of the first and/or second wafer.

11. A manufacturing system comprising the apparatus of claim 1, further comprising:
   a load port module configured and dimensioned to introduce the first wafer and the second wafer into the manufacturing system;
   a plasma module configured to perform a plasma treatment of a surface of at least one of the first wafer and the second wafer introduced in the manufacturing system;
   a cleaning module configured to clean the surface of at least one of the first wafer and the second wafer; and
   a moveable robot device configured and dimensioned to transport at least one of the first wafer and the second wafer from one of either the load port module, plasma module, cleaning module, and loadlock module to any other one of these modules.

* * * * *